United States Patent [19]

Windle et al.

[11] Patent Number: 4,905,123

[45] Date of Patent: Feb. 27, 1990

[54] HEAT SINK BUS ASSEMBLY

[75] Inventors: W. Eric Windle, Antwerp, Ohio; James W. Kruse, Fort Wayne, Ind.

[73] Assignee: Navistar International Transportation Corp., Chicago, Ill.

[21] Appl. No.: 106,096

[22] Filed: Oct. 8, 1987

[51] Int. Cl.[4] .......................... H05K 7/00; H05K 7/20
[52] U.S. Cl. ..................................... 361/388; 361/386; 361/397; 361/399; 361/407; 174/16.2
[58] Field of Search ............... 361/386, 387, 388, 395, 361/399, 407, 427, 378, 355, 361; 165/80.2, 80.3; 357/75, 81; 174/16 HS, 16.2, 16.3; 248/200; 363/141; 307/9.1, 10.1

[56] References Cited

U.S. PATENT DOCUMENTS

| | | | |
|---|---|---|---|
| 3,670,208 | 6/1972 | Hovnanian et al. | 361/409 |
| 4,047,242 | 9/1977 | Jakob et al. | 361/389 |
| 4,301,493 | 11/1981 | Schweikle et al. | 361/355 |
| 4,307,437 | 12/1981 | Severing | 310/68 D |
| 4,366,528 | 12/1982 | Cole | 361/429 |
| 4,409,641 | 10/1983 | Jakob et al. | 361/386 |
| 4,589,057 | 5/1986 | Short | 361/386 |
| 4,700,271 | 10/1987 | Iio et al. | 361/361 |
| 4,720,645 | 1/1988 | Stroud | 310/68 D |

OTHER PUBLICATIONS

"Linear Integrated Circuits and MOS/FET's", Databook Series SSD-240B, RCA Corporation, 1982, p. 1066.

Primary Examiner—A. D. Pellinen
Assistant Examiner—David Osborn
Attorney, Agent, or Firm—F. David AuBuchon; Dennis K. Sullivan

[57] ABSTRACT

The heat sink bus assembly is adapted to be connected to a printed circuit board having conductor structure leading to conductive foil and printed circuit board mounting structure for physically mounting the printed circuit board components and conduct heat to an enclosure. The printed circuit board is adapted to be mounted in a partially sealed enclosure which is relatively highly thermally conductive. The bus assembly has physically secured thereto high heat generating devices and other devices adjacent to the printed circuit board, is energizable to selectively supply power to a portion of the devices secured thereto, and functions to dissipate heat generated by the high heat generating devices secured thereto by conducting the heat to an enclosure. The bus assembly includes a bus which has relatively high thermal and electrical conductance, and which has bus mounting structure and device securing structure adapted to secure heat generating devices to the bus and to position secured devices to be electrically connected to the conductor structure of the printed circuit board, and mounting means complementary to the bus mounting structure and the printed circuit board mounting structure to mount the bus spaced from but adjacent to the printed circuit board.

13 Claims, 3 Drawing Sheets

HEAT SINK BUS ASSEMBLY

BACKGROUND OF THE INVENTION

1. Field of the Invention

The present invention relates to heat sinks employed to dissipate heat away from heat generating electronic devices, and to buses which supply power to electronic devices. This combined heat sink and bus is to be employed with printed circuit boards in a partially sealed metallic enclosure to protect them from a generally hostile environment. Typically, a printed circuit board has a foil conductor which supplies power to the electronic active components mounted on the printed circuit board and another foil path at a ground or common potential. Often a printed circuit board will have multiple foil layers, each providing a plurality of conductor foils for various purposes. These foil levels are accessed by conductor structure, typically a hole, leading to appropriate foil conductors, into which leads from the various components are inserted for connection to the foil paths. Similarly, the printed circuit board may include mounting structure for physically mounting various printed board components such as a terminal strip of whatever type.

Heat sinks to dissipate heat away from the electronic active components, which generate relatively high levels of heat, have long been known in the art. An example of various heat sinks known in the art is provided in a publication of RCA, entitled "Linear Integrated Circuits and Mosfets" at page 1066 and published in October, 1982. The RCA heat sink illustrated is an integral heat sink projecting upward from a dual-in-line integrated circuit and is integral with the dual-in-line integrated circuit and a suggested hardware mounting for a T0-220 style package.

The amount of heat generated by a printed circuit board mounted electronic device continues to increase and unless the heat is dissipated away from the electronic device, the device will fail. It is believed that the traditional route of employing a chassis as a heat sink, for devices which have tabs at a common level, or providing an off board heat sink for high heat generating devices is not particularly suitable for the newer high heat generating devices which are switched at logic level voltages. At one time, it was believed that very high heat generating devices, such as SCRs should be mounted off board on separate heat sink arrangements, which may also act as buses. Although this approach does switch a very high heat generating device at close to logic levels, the resulting wiring and electro-magnetic interference among the various conductors posed considerable problems, which were, with some labor, successfully surmounted to a considerable degree. The off board heat sinks possessed a considerable advantage of being subject to the flow of cooling fluid to include air, across all their exposed surface. The flow of cooling fluid across all their surfaces considerably increased the amount of heat which could be successfully dissipated away from the active device mounted on the heat sink.

At least one published patent deals with printed circuit board mounted buses. U.S. Pat. No. 3,670,208 to Hovnanian et al for a MICROELECTRIC PACKAGE, BUS STRIP AND PRINTED CIRCUIT BASE ASSEMBLY describes board mounted strips, namely ground and voltage supply buses located on a card between each aligned row of wire lead mounting terminals such as holes. This patent describes various solutions to the shielding problems created by providing a power bus on the printed circuit board. It is not believed that the Hovnanian et al power buses provided any significant heat sinking, nor is any heat sinking effect discussed in the patent.

An operative printed circuit board has a great number of soldered electrical connections between component leads and the foil. The reliability of the board may be vastly enhanced by wave soldering these electrical connections. Further, wave soldering considerably reduces the costs involved in manufacturing. Often a fixture will be employed to secure the components to the board during the wave soldering process.

The previously proposed grounding and heat sink systems allow for considerable improvement in reducing the number of hardware mounting pieces to mount board components, and in the reduction of manufacturing time and costs. Additionally, improvements in power distribution and in the reduction of switching current transients in the circuit board are desirable. In any printed circuit board, board space is at a premium and the ability to achieve the same functions with reduced board space is also desirable. Lastly, there exists a need for better heat sinking of high heat generating devices which are preferably directly connected by their leads to the conductive foil of the boards.

SUMMARY OF THE INVENTION

According to the invention, there is provided a heat sink bus assembly adapted to be mounted to a printed circuit board and to conduct heat to an enclosure. The printed circuit board has conductor structure leading to conductive foil and printed circuit board mounting structure for physically mounting printed circuit board components. The bus assembly of the present invention physically secures high heat generating devices, and other devices, adjacent to the printed circuit board, selectively supplies power to a portion of the devices secured, and dissipates the heat generated by the high heat generating devices, secured to the bus, to the enclosure. The bus assembly includes a bus and mounting means. The bus has relatively high thermal and electrical conductance and includes bus mounting structure, and device securing structure adapted to secure heat dissipating devices to the bus and to position secured devices to be electrically connected to the conductor structure of the printed circuit board. The mounting means is complementary to the bus mounting structure and to the printed circuit board mounting structure for mounting the bus spaced from but adjacent to the printed circuit board.

BRIEF DESCRIPTION OF THE DRAWINGS

FIG. a fragmentary perspective view partially in section of a U-shaped heat sink bus assembly and shows a partially sealed enclosure with portions of the enclosure broken away.

DESCRIPTION OF THE PREFERRED EMBODIMENT

Figure 1:
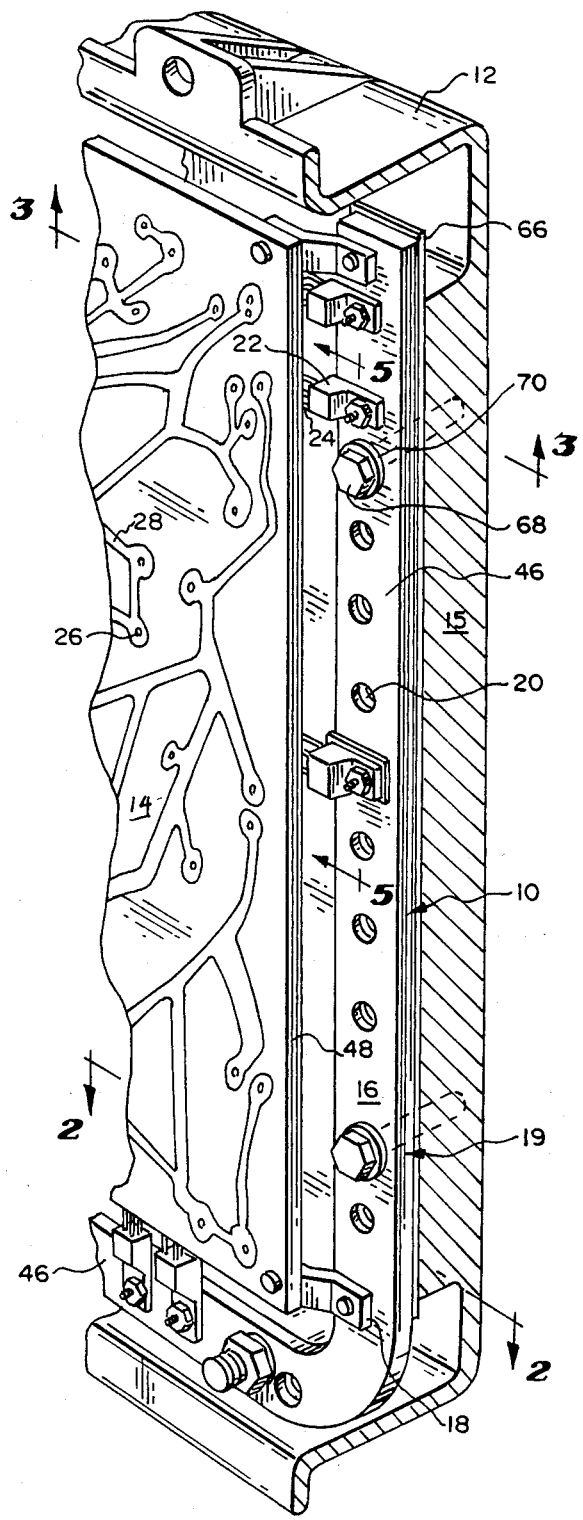

In FIG. 1 is shown a perspective view of a heat sink bus assembly 10 constructed according to the teachings of the present invention in its intended environment within a partially sealed metallic enclosure 12 partially broken away to show bus assembly 10 and printed circuit board 14. The bus assembly 10 and the board 14 are intended to be employed in hostile environments where they would be exposed to water and contaminants, which could cause damage but for the presence of enclosure 12. In particular, the bus assembly 10, the enclosure 12 and the circuit board 14 are intended for land vehicular use where the enclosure 12 tends to protect the circuit board 14 from water, grease, dust and other environmental elements which would otherwise degrade their performance and to dissipate heat generated within the enclosure 12.

The bus assembly 10 of the present invention when used with the printed circuit board 14 and installed in the enclosure 12 achieves a number of advantages in inventive concept, over previously proposed circuit board and bus assembly systems. Manufacturing costs, time, and the number of mounting pieces employed to mount components to the board 14 are reduced. This is achieved with very little dedicated printed circuit board 14 space while providing for better power distribution, and the removal of the greater portion of switching current transients from the printed circuit board 14. The bus assembly 10, in conjunction with enclosure 12, also provides the needed heat sink for high heat generating active electronic components while avoiding some of the more complex and expensive measures previously employed.

In addition to protecting heat sink bus assembly 10 and printed circuit board 14 from the hostile environment, the enclosure 12 dissipates the heat conducted to it by bus 16 of the assembly 10 and heat generated in the space enclosed in the enclosure 12. Enclosure 12 is at least thermally conductive in at least a conductive portion 15 adjacent bus 16. Most economically, enclosure 12 is completely metallic and has good thermal and electrical conductance.

The bus assembly 10 includes the bus 16, mounting members 18 which secure the bus 16 to the printed circuit board 14 and enclosure mounting means 19 for securing bus 16 to enclosure 12. The bus 16 includes device mounting structure 20, here shown as a hole, for physically securing heat generating devices 22 to the bus 16, thermally and electrically coupling each device 22 to the bus 16 to supply power, where desired, and dissipating heat away from each device 22.

In addition to physically securing each device 22 to the bus 16 and coupling the two for energy transfer, the device mounting structure 20 further positions each device 22 so that leads 24 for the device 22 may be positioned for engagement to a conductor structure 26 of the printed circuit board 14.

Figure 2:
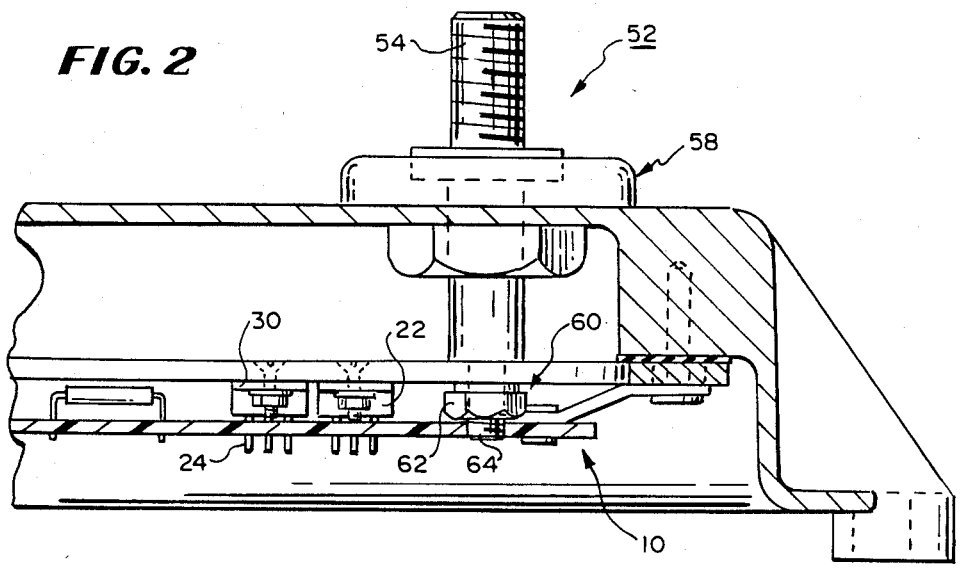
FIG. 2 is a fragmentary sectional view taken along line 2—2 of FIG. 1 and shows one leg of the U-shaped shaped heat sink bus assembly.
Figure 3:
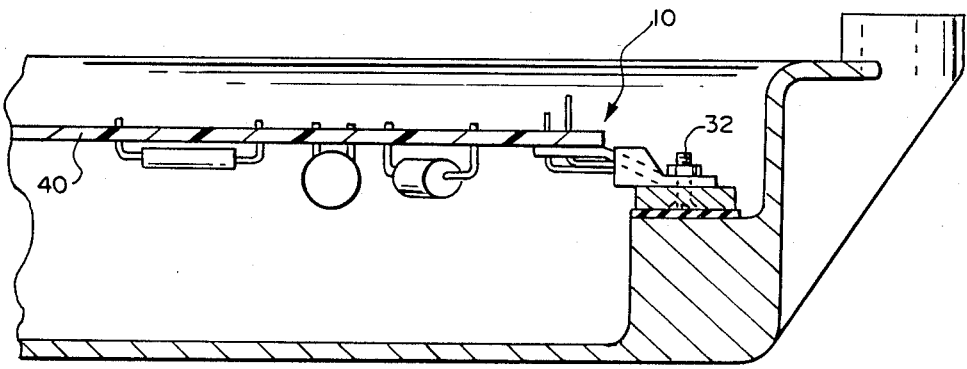
FIG. 3 is a fragmentary sectional view taken along line 3—3 of FIG. and shows a feedthrough leading to the heat sinking bus.

The conductor structure 26 is here shown as a hole leading to a conductive foil 28 to allow an electrical connection to be made between the leads 24 and the conductive foil 28. In short, the bus assembly 10 serves as a permanently mounted fixture to appropriately position the devices 22 with regard to the printed circuit board 14. Typically, each device 22 includes a sink tab 30 shown in FIG. 2 which serves both as a device lead and a means for dissipating heat from the inside of each device 22. The device mounting structure 20 is aligned with a hole in a sink tab 30 to mount a device 22 to the bus 16 typically by means of a fastener 32 (FIG. 3). The fastener 32, of course, may be any one of a variety of fastening components, and typically screws and nuts are employed where appropriate.

Figure 4:
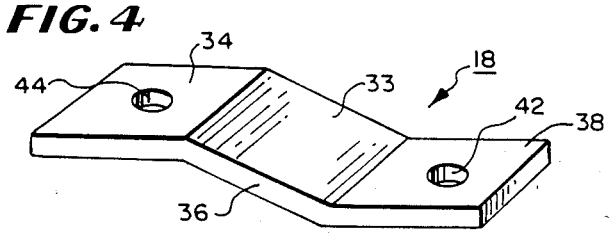
FIG. 4 is a perspective view of an angle bracket which locates the bus assembly.

The mounting member 18 is employed to secure the bus 16 to the circuit board 14 and is shown in FIG. 4 as an angle bracket 33, having a base portion 34, an angled portion 36 and a bus portion 38. Additionally, each mounting member 18 serves to space the bus 16 away from the printed circuit board 14. The base portion 34 is contiguous with a printed circuit board surface 40. The angled portion 36 elevates the bus portion 38 of the angle bracket 33 and hence the bus 16, from the printed circuit board 14. The bus portion 38 is contiguous with the bus 16.

The fastener 32 interacts with the bus mounting structure 42, here shown as a hole, to physically secure the bus portion 38 to the bus 16. Similarly, the fastener 32 interacts with the printed circuit board mounting structure 44, here shown as a hole, to physically secure the base portion 34 to the printed circuit board 14.

Preferably, the angled portion 36 not only spaces the bus 16 away from the planar board surface 40, but it is so aligned with respect to the printed circuit board 14 as to cause elongate portions 46 of the bus 16 to project laterally beyond a periphery 48 of the printed circuit board 14. As shown in the drawing, the bus 16 has a number of elongate portions 46 arranged in the form of a rectangular letter U, and all elongate portions 46 project laterally beyond periphery 48 of printed circuit board 14 to surround or frame three sides of a typically rectangular printed circuit board 14.

Heat generation of power switching components in the enclosure 12 may be reduced by providing a direct connection to bus 16 by means of a feedthrough 52. Use of the feedthrough 52 minimizes high resistance connections and electrical paths by directly connecting bus 16 to a conductor outside enclosure 12 which leads to the power supply for the components. Additionally, this direct connection avoids high current paths on the printed circuit board 14 and bundled wires which can lead to difficulties associated with switching transients. Further, the feedthrough 52 provides some degree of physical support to locate the bus assembly 10 and the printed circuit board 14 within the enclosure 12. The feedthrough 52 includes a stud 54, a molded insulator portion 58 and a bus fastening assembly 60. The stud 54 provides a current path from a conductor (not shown), leading to a power supply outside the enclosure to the bus 16, to the bus fastening assembly 60. The bus fastening assembly 60 includes a nut 62 which engages threads 64 on the stud 54 to connect the stud 54 to the bus 16. The molded insulator 58 electrically isolates the stud 54 from the conductive enclosure 12 and locates the stud 54 with regard to the enclosure 12.

While enclosure 12 need not be operated at ground or common potential, it is preferable that it not be operated at a differing potential from ground. Bus 16 is secured to enclosure 12 in a manner to promote the conduction of heat to enclosure 12 but is electrically isolated from enclosure 12 by bus insulator 66. The bus insulator 66 is interposed between bus 16, enclosure 12 and portions of enclosure mounting means 19. The bus insulator 66 is a good thermal conductor and a very poor electrical conductor such as: silicon-rubber-fiberglass composites, mica, or aluminum oxide ceramics. Of course, the bus insulator 66 should also electrically isolate any structure associated with bus 16 which would short the bus 16 to enclosure 12, such as fastener 32. Enclosure fastening, means 19 should similarly electrically isolate bus 16 from conductive portions of enclosure 12. The greater the surface area of bus 16 and insulator 66 contiguous with enclosure 12, the greater the conduction of heat to enclosure 12. As illustrated in FIG. 1, enclosure fastening means 19 is an ordinary metallic screw 68 tapped to enclosure 12 and insulated from bus 16 by insulated washer 70.

The heat generating devices 22 need not all be of the same polarity to obtain the benefit of heat sinking through the bus 16. Nor need the physical arrangement of the sink tabs 30 be the same to obtain the benefit of heat sinking from the bus 16. Sink tabs 30 might be designed to operate at a positive voltage or a negative voltage, or at ground. The tabs 30 which are not at the bus 16 potential may still obtain the benefit of heat sinking from the bus 16 by being connected to the bus 16 by insulated fastening means 72 shown in FIG. 5.

Figure 5:
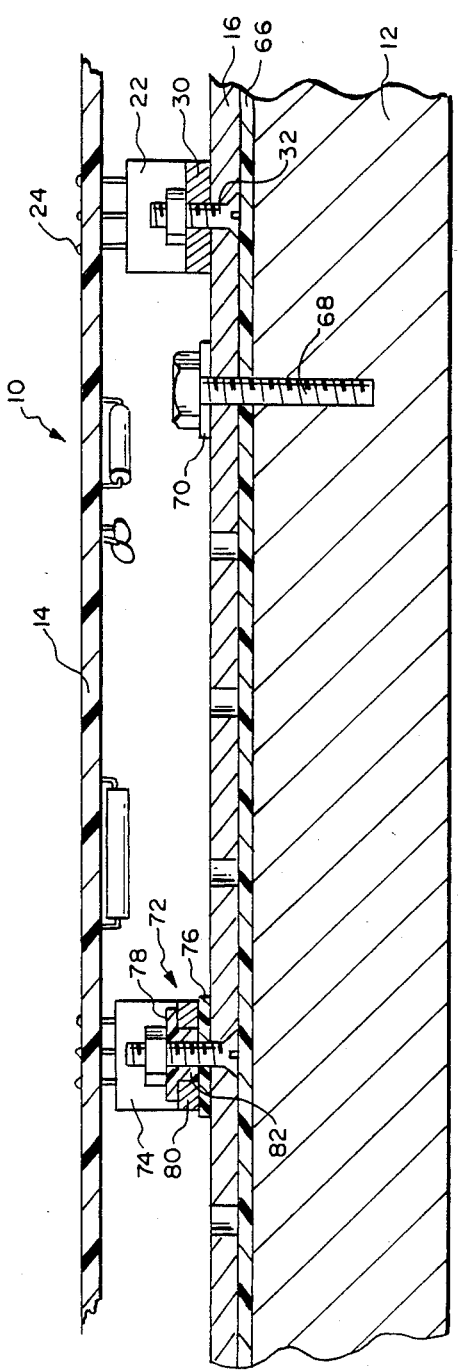
FIG. 5 is a cross-section orthogonal view of a portion of the bus assembly and enclosure of FIG. 1.

FIG. 5 provides an illustration of mounting differing polarity devices to bus 16 so that all devices conduct heat to bus 16 and enclosure 12. The mounting of devices 22 which are supplied power by bus 16 has previously been discussed. Differing polarity devices 74 are mounted similarly with the addition of heat conductive insulating washers 76, 78 or their equivalent, so that the differing polarity devices 74 are electrically insulated from the bus 16 and transmit the heat they generate to the bus 16.

Tab 80 of the device 74 is insulated from the bus 16 by flat washer 76. The portion of fastener 32 adjacent tab 80 is similarly isolated by protuberant washer 78 that has a portion 82 extending through a hole in tab 80. Insulated washers 76, 78 may be fabricated from a material similar to those discussed in connection with bus insulator 66.

In the event that there are a plurality of the devices 22, 74 whose sink tabs 30, 80 operate at positive, negative or ground potential, the bus 16 may be segmented into discreet separate portions, and each portion fed the appropriate supply, through a plurality of feedthroughs 52. Of course, this would require a separate plurality of mounting members 18 for each segment of the bus 16.

As those skilled in the art will readily recognize, some aspects of the elements of the heat sink bus assembly 10 may be modified from the preferred embodiment without adversely affecting the performance of the heat sink bus assembly 10. From the foregoing description, it will be apparent that a, number of modifications can be made to the heat sink bus assembly 10 of the present invention without departing from the teachings of the present invention. Also, it will be appreciated that the invention has a number of advantages, some of which have been described above and others of which are inherent in the invention. Accordingly, the scope of the invention is only to be limited as necessitated by the accompanying claims.

I claim:

1. A heat sink bus assembly which is mounted to high heat generating devices, to and within an enclosure, and to a printed circuit board within the enclosure comprising:

a bus having at least first and second spaced apart surfaces and having high thermal and electrical conductance, said bus including device mounting structure thermally and electrically coupling said high heat generating devices thereto and means electrically coupling said bus to a power supply means;

circuit board mounting means attached to and extending away from said first surface, said circuit board mounting means mechanically securing said circuit board to said bus; and enclosure mounting means electrically coupled to said bus and attached to and extending away from said second surface, said enclosure mounting means mechanically securing said enclosure to said bus, said enclosure mounting means and said bus being electrically insulated from the enclosure.

2. The heat sink bus assembly of claim 1 wherein said circuit board mounting means include mounting members each comprising:

an angle bracket having a planar base portion including circuit board mounting structure;

a planar bus portion including bus mounting structure, said bus portion being parallel to said base portion;

an angled portion separating the bus portion and the base portion; and fastener means securing said bus portion of said bracket to said bus via said bus mounting structure and securing said base portion to the circuit board via said circuit board mounting structure.

3. The heat sink bus assembly of claim 2 wherein said bus has an approximate rectangular U shape, is generally planar and comprises a plurality of elongate members.

4. The heat sink bus assembly of claim 3 wherein said plurality of elongate members includes at least three elongate members.

5. The heat sink bus assembly of claim 4 wherein said elongate members frame at least three sides of a circuit board, in a plane parallel to the plane of the circuit board, and are positioned radially outwardly of a periphery of the circuit board.

6. The heat sink bus assembly of claim 5 wherein said bus portion and said base portion of said circuit board mounting means are angularly separated and space said circuit board radially inwardly of said bus when mounted therebetween.

7. The heat sink bus of claim 1 further including thermally conductive electrical insulators associated respectively with device mounting structures of said bus for electrically insulating those devices mounted to said bus requiring electrical insulation from said bus while allowing transfer of heat from said electrical insulated devices to said bus.

8. The heat sink bus assembly of claim 1 wherein said enclosure mounting means comprise an electrically conductive stud electrically and mechanically connected to and protruding from said bus in a direction away from said circuit board mounting means.

9. The heat sink bus assembly of claim 8 wherein said stud is electrically insulated from a feedthrough in an enclosure through which it extends and electrically couples a conductor leading to a power supply to said bus.

10. The heat sink bus assembly of claim 1 wherein said device mounting structure further includes means for positioning the devices secured to said bus relative to the circuit board for electrical connection of the devices to conductive pathways of the circuit board.

11. The heat sink bus assembly of claim 1 further including a thermally conductive electrical insulator for electrically isolating said bus from an enclosure mounted to and enclosing said bus.

12. In combination with a circuit board, a plurality of heat generating devices and a device sup-ply current,
   a heat sink bus assembly having high thermal and electrical conductance and including device mounting structure thermally and electrically coupling said high heat generating devices thereto,
   circuit board mounting means attached to and extending from said bus assembly mechanically securing said circuit board to said bus assembly and having electrically conductive enclosure mounting means attached thereto and extending therefrom, said enclosure mounting means being adapted for electrical engagement to a device supply current for supplying current to said circuit board via said heat generating devices mounted on said bus assembly, and being electrically insulated from an enclosure mounted over said bus and said circuit board.

13. The combination of claim 12 wherein said heat generating devices mounted on said bus assembly are adapted to supply current from said bus to said circuit board thereby to reduce switching transients on said board.

* * * * *